(12) United States Patent
Kuo et al.

(10) Patent No.: US 8,755,003 B2
(45) Date of Patent: Jun. 17, 2014

(54) BACKBOARD FOR DISPLAY AND LIQUID CRYSTAL DISPLAY

(75) Inventors: Yi-cheng Kuo, Guandong (CN); Yu-chun Hsiao, Guandong (CN); Chengwen Que, Guandong (CN); Pangling Zhang, Guandong (CN); Dehua Li, Guandong (CN)

(73) Assignee: Shenzhen China Star Optoelectronics Technology co., Ltd., Shenzhen, Guangdong (CN)

( * ) Notice: Subject to any disclaimer, the term of this patent is extended or adjusted under 35 U.S.C. 154(b) by 62 days.

(21) Appl. No.: 13/574,610

(22) PCT Filed: Jul. 12, 2012

(86) PCT No.: PCT/CN2012/078555
§ 371 (c)(1),
(2), (4) Date: Jul. 22, 2012

(65) Prior Publication Data
US 2014/0016060 A1 Jan. 16, 2014

(51) Int. Cl.
*G02F 1/1333* (2006.01)

(52) U.S. Cl.
USPC ............................................. 349/58

(58) Field of Classification Search
USPC ............................................. 349/58
See application file for complete search history.

(56) References Cited

U.S. PATENT DOCUMENTS

2008/0100770 A1* 5/2008 Chen et al. ............. 349/58

* cited by examiner

*Primary Examiner* — Richard Kim
(74) *Attorney, Agent, or Firm* — Andrew C. Cheng

(57) ABSTRACT

The present invention provides a collapsible backboard for liquid crystal display device which comprises first and second trusses each configured with an L-shaped configuration with a first elongated beam having a longitudinal end and a second short beam perpendicular to the elongated beam and having a lateral end. First and second linkages each has an elongated configuration with a first end and a second end, wherein the first linkage has its first and second ends pivotally hinged to the lateral end of the second short beam of the first truss, and the longitudinal end of the first elongated beam of the second truss, and wherein the second linkage has its first and second ends pivotally hinged to the longitudinal end of the first elongated beam of the first truss and the lateral end of the second short beam of the second truss.

13 Claims, 2 Drawing Sheets

BACKBOARD FOR DISPLAY AND LIQUID CRYSTAL DISPLAY

FIELD OF THE INVENTION

The present invention relates to a technological field of liquid crystal display, and more particularly, to a backboard for the liquid crystal display, and also a liquid crystal display device incorporated with such a backboard.

DESCRIPTION OF PRIOR ART

Backlight module is a key component of a liquid crystal display device. Since the liquid crystal does not emit any light, as a result, a liquid crystal display panel has to be incorporated with a light resource thereunder so as to have the patterns and images on the panel beautifully and satuatedly displayed. The purpose and function of incorporating the backlight module is to provide an evenly diffused and bright light source and properly projected toward the liquid crystal display such that the liquid crystal display can normally and continuously display the images on the panel.

The backboard is the key component of the backlight module. The backboard of the liquid crystal display is used as a chassis to house and protect other key components, and also provide a robust mechanic strength and rigidity of the liquid crystal display. Currently, the backboard of the liquid crystal display device is integrally made from a single piece. It has a bulky dimension which takes a great deal of volume during transportation and which eventually detrimental to the manufacturing cost.

Accordingly, there is a need for a novel backboard for the liquid crystal display device and also a liquid crystal display device incorporated with such backboard so as to resolve the prior art issue.

SUMMARY OF THE INVENTION

The purpose of the present invention is to provide a technical solution by introducing a backboard for liquid crystal display, and a liquid crystal display device incorporated with such a backboard. By collapsing the backboard to a compact position, the overall dimension of the backboard can be readily reduced for transportation purposes, while it can also effectively prevent the backboard from deformation during transportation.

In order to resolve the technical issues encountered by the prior art, a technical solution provided by the present invention is to introduce a collapsible backboard for liquid crystal display device and it comprises first and second trusses each configured with an L-shaped configuration with a first elongated beam having an longitudinal end and a second short beam perpendicular to the elongated beam and having a lateral end. First and second linkages each has an elongated configuration with a first end and a second end, wherein the first linkage has its first and second ends pivotally hinged to the lateral end of the second short beam of the first truss, and the longitudinal end of the first elongated beam of the second truss, and wherein the second linkage has its first and second ends pivotally hinged to the longitudinal end of the first elongated beam of the first truss and the lateral end of the second short beam of the second truss in a way that the backboard can be switched between a first position in which the first and second trusses and the first and second linkages are fully extended, and a second position in which the first and second trusses and the first and second linkages are collapsible to each other such that the first area enclosed by the first and second trusses and the first and second linkages under first position is larger than the second area enclosed by the first and second trusses and the first and second linkages situated in the second position. Wherein a length of the second short beam is shorter than the length of the first elongated beam and the length of the first and second linkages. Wherein the first and second linkages are perpendicular to the first elongated beams of the first and second trusses in the first position, and wherein the first and second linkages are in parallel to or in line with the first elongated beams of the first and second trusses in the second position, wherein at the hinged point located between lateral end of the short beam of the first truss and the first end of the first linkage, a distance between the hinged point and an inner edge of the first elongated beam is larger than or equal to a distance between the hinged point and an inner edge of the first linkage.

Wherein the first and second trusses and the first and second linkages are hinged with pinshafts.

Wherein the length of the linkage is longer than the length of the trusses.

In order to resolve the technical issues encountered by the prior art, a technical solution provided by the present invention is to introduce a collapsible backboard for liquid crystal display device and it comprises first and second trusses each configured with an L-shaped configuration with a first elongated beam having an longitudinal end and a second short beam perpendicular to the elongated beam and having a lateral end. First and second linkages each has an elongated configuration with a first end and a second end, wherein the first linkage has its first and second ends pivotally hinged to the lateral end of the second short beam of the first truss, and the longitudinal end of the first elongated beam of the second truss, and wherein the second linkage has its first and second ends pivotally hinged to the longitudinal end of the first elongated beam of the first truss and the lateral end of the second short beam of the second truss in a way that the backboard can be switched between a first position in which the first and second trusses and the first and second linkages are fully extended, and a second position in which the first and second trusses and the first and second linkages are collapsible to each other such that the first area enclosed by the first and second trusses and the first and second linkages under first position is larger than the second area enclosed by the first and second trusses and the first and second linkages situated in the second position.

Wherein the first and second trusses and the first and second linkages are hinged with pinshafts.

Wherein a length of the second short beam is shorter than the length of the first elongated beam and the length of the first and second linkages; wherein the first and second linkages are perpendicular to the first elongated beams of the first and second trusses in the first position, and wherein the first and second linkages are in parallel to or in line with the first elongated beams of the first and second trusses in the second position.

Wherein at the hinged point located between lateral end of the short beam of the first truss and the first end of the first linkage, a distance between the hinged point and an inner edge of the first elongated beam is larger than or equal to a distance between the hinged point and an inner edge of the first linkage.

Wherein the length of the linkage is longer than the length of the trusses.

In order to resolve the technical issues encountered by the prior art, a technical solution provided by the present invention is to introduce a liquid crystal display device incorporated with a collapsible backboard which it comprises first and second trusses each configured with an L-shaped configuration with a first elongated beam having an longitudinal end and a second short beam perpendicular to the elongated beam and having a lateral end. First and second linkages each has an elongated configuration with a first end and a second end, wherein the first linkage has its first and second ends pivotally hinged to the lateral end of the second short beam of the first truss, and the longitudinal end of the first elongated beam of the second truss, and wherein the second linkage has its first and second ends pivotally hinged to the longitudinal end of the first elongated beam of the first truss and the lateral end of the second short beam of the second truss in a way that the backboard can be switched between a first position in which the first and second trusses and the first and second linkages are fully extended, and a second position in which the first and second trusses and the first and second linkages are collapsible to each other such that the first area enclosed by the first and second trusses and the first and second linkages under first position is larger than the second area enclosed by the first and second trusses and the first and second linkages situated in the second position.

Wherein the first and second trusses and the first and second linkages are hinged with pinshafts.

Wherein a length of the second short beam is shorter than the length of the first elongated beam and the length of the first and second linkages; wherein the first and second linkages are perpendicular to the first elongated beams of the first and second trusses in the first position, and wherein the first and second linkages are in parallel to or in line with the first elongated beams of the first and second trusses in the second position.

Wherein at the hinged point located between lateral end of the short beam of the first truss and the first end of the first linkage, a distance between the hinged point and an inner edge of the first elongated beam is larger than or equal to a distance between the hinged point and an inner edge of the first linkage.

Wherein the length of the linkage is longer than the length of the trusses.

The present invention can be concluded with the following advantages: as compared to the existing prior art, by introducing a collapsible backboard configured with the L-shaped truss and elongated linkage pivotally hinged together, the backboard can be readily collapsed so as to reduce its overall dimension so as to benefit transportation. In addition, the backboard can be effectively prevented from deformation during transportation because of the collapsed arrangement.

DETAILED DESCRIPTION OF PREFERRED EMBODIMENTS

Figure 1:
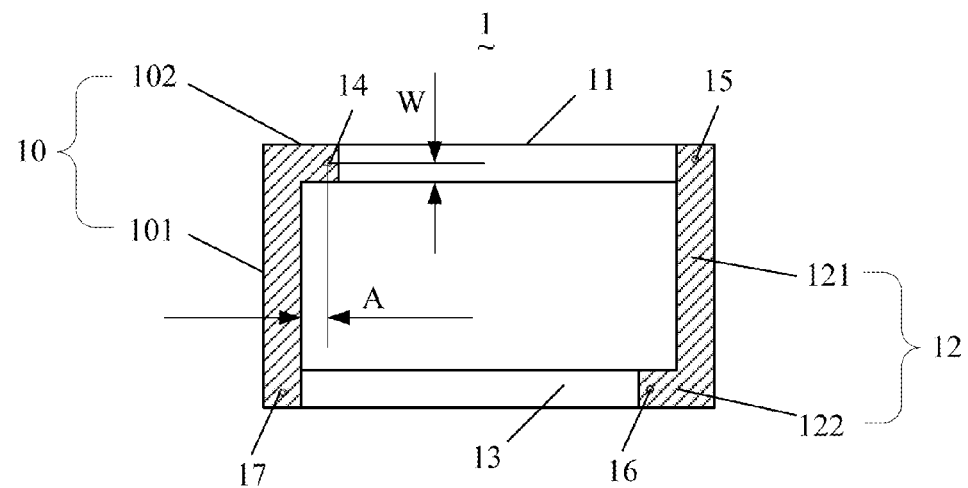
FIG. 1 is an illustrational and structural view of a backboard for the liquid crystal display device made in accordance of the present invention and situated in a first position.
Figure 2:
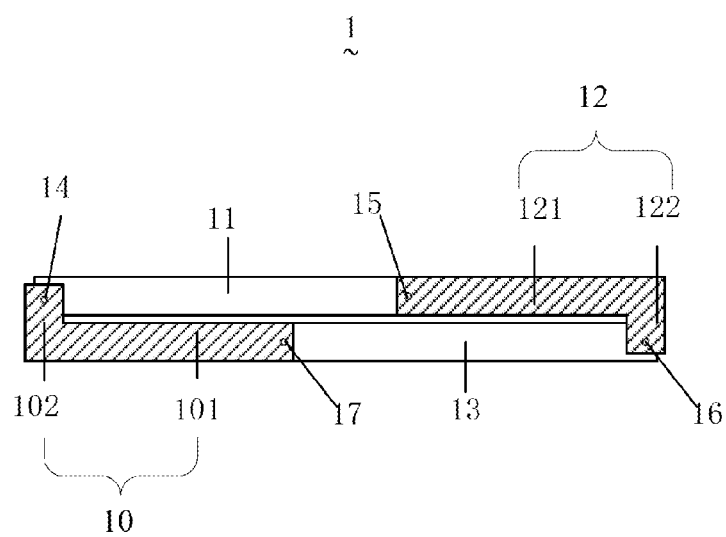
FIG. 2 is an illustrational and structural view of a backboard for the liquid crystal display device made in accordance with the present invention and situated in a second position.

Referring to FIG. 1 which is an illustrational and structural view of a backboard for the liquid crystal display device made in accordance with the present invention and situated in a first position; and FIG. 2 which is an illustrational and structural view of a backboard for the liquid crystal display device made in accordance with the present invention and situated in a second position. In the current embodiment, the backboard 1 for use with a liquid crystal display device includes a pair of trusses 10 and 12, i.e. first and second trusses, and a pair of or first and second linkages 11 and 13.

In the current embodiment, both of the first and second trusses 10 and 12 are arranged with an L-shaped configuration. The first truss 10 includes a first elongated beam 101 having a longitudinal end and a second short beam 102 having a lateral end. The second short beam 102 is perpendicular to the longitudinal end. The second truss 12 has the mirror imaged configuration of the first truss 10, and includes a first longitudinal beam 121 having a longitudinal end, and a second short beam 122 having a lateral end and is perpendicular to the longitudinal beam 121.

The first and second linkages 11 and 13 have a plain and elongate configuration, and each has a first and second end (not labeled). The first linkage 11 has its first and second ends pivotally hinged to the lateral end of the second short beam 102 of the first truss 10, and the longitudinal end of the first elongated beam 121 of the second truss 12, and wherein the second linkage 13 has its first and second ends pivotally hinged to the longitudinal end of the first elongated beam 101 of the first truss 10 and the lateral end of the second short beam 122 of the second truss 12.

By the pivotally hinged arrangement of the first and second trusses 10, 12 and the first and second linkages 11 and 13, the backboard 1 made in accordance with the present invention can be readily switched between the first position such as shown in FIG. 1, and the second position such as shown in FIG. 2. It can be readily seen that the first area enclosed by the first and second trusses and the first and second linkages situated the first position is larger than the second area enclosed by the first and second trusses and the first and second linkages situated in the second position.

It should be clarify that under the first position, the first area enclosed by the first and second trusses 10, 12 and the first and second linkages 11, 13 situated the first position is comparably larger such that it can readily serve as a backboard of a backlight module for a liquid crystal display device so as to house and protect those optical components of the backlight module. In addition, the backboard can also provide a mechanical rigidity of the liquid crystal display device. However, under the second position, both the first and second trusses 10, 12 and the first and second linkages 11 and 13 are collapsed together so as to reduce the overall enclosed area. The compact size is specially preferable and beneficial for storage or transportation. With the same storing area, more collapsed backboard 1 can be stored, or more backboard 1 can be transported with the same capacity. As a result, the efficiency is therefore increased. In addition, since the overall dimension is reduced, and the capability of resisting deformation during transportation is therefore increased.

It should be noted that in the current embodiment, the length of the second short beams 102, 122 is shorter than the first longitudinal beams 101, 121, and the first and second linkages 11, 13. Accordingly, when the backboard 1 is situated in the first position, the first and second linkages 11, 13 are perpendicular to the first longitudinal beams 101 and 121, while under the second position, the first and second linkages 11, 13 are in parallel to the first longitudinal beams 101, 121 or they can in line with each other along a common direction. In addition, the length of the first and second linkages 11, 13 is preferably longer than the second short beams 102, 122 so as to meet the requirements of current manufacturing standard. In other embodiment, the length of those elements or components can be readily changed or modified according to the field or design requirements as long as the backboard 1 can be readily switched between an extended position and a collapsed position.

In the current embodiment, the first and second trusses 10, 12 and the first and second linkages 11, 13 are pivotally hinged with pinshafts 14, 15, 16 and 17. In other embodiment, the first and second trusses 10, 12 and the first and second linkages 11, 13 can be pivotally interlinked with other measurements known to the skilled in this or other art. In order to achieve a better collapsible result, at the hinged points between the linkages 11, 13 and the lateral ends of the second short beams 102, 122 of the first and second trusses 10, 12, a distance "A" between the hinged point and an inner edge of the first elongated beam 101, 121 is larger than or equal to a distance "W" between the hinged point and an inner edge of the first and second linkages 11, 13.

Figure 3:
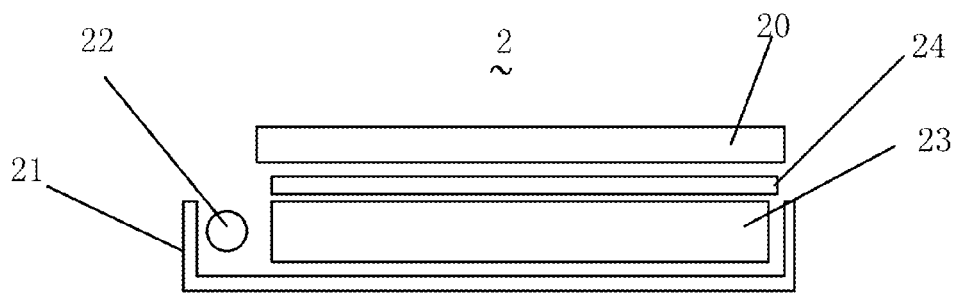
FIG. 3 is an illustration and structural view of a liquid crystal display device made in accordance with the present invention.

In addition, the present invention further provides a liquid crystal display device. Please refer to FIG. 3 which is an illustration and structural view of a liquid crystal display device made in accordance with the present invention. The liquid crystal display device 2 includes a liquid crystal display panel 20, a backboard 21, and optical components arranged between the panel 20 and the backboard 21, such as light source 22, a waveguide 23, and an optical film 24. The backboard 21 can be embodied with any one of the embodiments disclosed above.

As compared to the existing prior art, by introducing a collapsible backboard configured with the L-shaped truss and elongated linkage pivotally hinged together, the backboard can be readily collapsed so as to reduce its overall dimension so as to benefit transportation. In addition, the backboard can be effectively prevented from deformation during transportation because of the collapsed arrangement.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

The invention claimed is:

1. A collapsible backboard for liquid crystal display device, comprising:
   first and second trusses each configured with an L-shaped configuration with a first elongated beam having an longitudinal end and a second short beam perpendicular to the elongated beam and having a lateral end;
   first and second linkages each having an elongated configuration with a first end and a second end, wherein the first linkage has its first and second ends pivotally hinged to the lateral end of the second short beam of the first truss, and the longitudinal end of the first elongated beam of the second truss, and wherein the second linkage has its first and second ends pivotally hinged to the longitudinal end of the first elongated beam of the first truss and the lateral end of the second short beam of the second truss in a way that the backboard can be switched between a first position in which the first and second trusses and the first and second linkages are fully extended, and a second position in which the first and second trusses and the first and second linkages are collapsible to each other such that; wherein a length of the second short beam is shorter than the length of the first elongated beam and the length of the first and second linkages; wherein the first and second linkages are perpendicular to the first elongated beams of the first and second trusses in the first position, and wherein the first and second linkages are in parallel to or in line with the first elongated beams of the first and second trusses in the second position, wherein at the hinged point located between lateral end of the short beam of the first truss and the first end of the first linkage, a distance between the hinged point and an inner edge of the first elongated beam is larger than or equal to a distance between the hinged point and an inner edge of the first linkage.

2. The backboard of the liquid crystal display device as recited in claim 1, wherein the first and second trusses and the first and second linkages are hinged with pinshafts.

3. The backboard of the liquid crystal display device as recited in claim 1, wherein the length of the linkage is longer than the length of the trusses.

4. A collapsible backboard for liquid crystal display device, comprising:
   first and second trusses each configured with an L-shaped configuration with a first elongated beam having an longitudinal end and a second short beam perpendicular to the elongated beam and having a lateral end;
   first and second linkages each having an elongated configuration with a first end and a second end, wherein the first linkage has its first and second ends pivotally hinged to the lateral end of the second short beam of the first truss, and the longitudinal end of the first elongated beam of the second truss, and wherein the second linkage has its first and second ends pivotally hinged to the longitudinal end of the first elongated beam of the first truss and the lateral end of the second short beam of the second truss in a way that the backboard can be switched between a first position in which the first and second trusses and the first and second linkages are fully extended, and a second position in which the first and second trusses and the first and second linkages are collapsible to each other such that the first area enclosed by the first and second trusses and the first and second linkages under first position is larger than the second area enclosed by the first and second trusses and the first and second linkages situated in the second position.

5. The backboard of the liquid crystal display device as recited in claim 4, wherein the first and second trusses and the first and second linkages are hinged with pinshafts.

6. The backboard of the liquid crystal display device as recited in claim 4, wherein a length of the second short beam is shorter than the length of the first elongated beam and the length of the first and second linkages; wherein the first and second linkages are perpendicular to the first elongated beams of the first and second trusses in the first position, and wherein the first and second linkages are in parallel to or in line with the first elongated beams of the first and second trusses in the second position.

7. The backboard of the liquid crystal display device as recited in claim 6, wherein at the hinged point located between lateral end of the short beam of the first truss and the first end of the first linkage, a distance between the hinged point and an inner edge of the first elongated beam is larger than or equal to a distance between the hinged point and an inner edge of the first linkage.

8. The backboard of the liquid crystal display device as recited in claim 4, wherein the length of the linkage is longer than the length of the trusses.

9. A liquid crystal display device having a collapsible backboard, comprising:

first and second trusses each configured with an L-shaped configuration with a first elongated beam having an longitudinal end and a second short beam perpendicular to the elongated beam and having a lateral end;

first and second linkages each having an elongated configuration with a first end and a second end, wherein the first linkage has its first and second ends pivotally hinged to the lateral end of the second short beam of the first truss, and the longitudinal end of the first elongated beam of the second truss, and wherein the second linkage has its first and second ends pivotally hinged to the longitudinal end of the first elongated beam of the first truss and the lateral end of the second short beam of the second truss in a way that the backboard can be switched between a first position in which the first and second trusses and the first and second linkages are fully extended, and a second position in which the first and second trusses and the first and second linkages are collapsible to each other such that the first area enclosed by the first and second trusses and the first and second linkages under first position is larger than the second area enclosed by the first and second trusses and the first and second linkages situated in the second position.

10. The liquid crystal display device as recited in claim 9, wherein the first and second trusses and the first and second linkages are hinged with pinshafts.

11. The liquid crystal display device as recited in claim 9, wherein a length of the second short beam is shorter than the length of the first elongated beam and the length of the first and second linkages; wherein the first and second linkages are perpendicular to the first elongated beams of the first and second trusses in the first position, and wherein the first and second linkages are in parallel to or in line with the first elongated beams of the first and second trusses in the second position.

12. The liquid crystal display device as recited in claim 11, wherein at the hinged point located between lateral end of the short beam of the first truss and the first end of the first linkage, a distance between the hinged point and an inner edge of the first elongated beam is larger than or equal to a distance between the hinged point and an inner edge of the first linkage.

13. The liquid crystal display device as recited in claim 9, wherein the length of the linkage is longer than the length of the trusses.

* * * * *